United States Patent [19]

Thomas et al.

[11] Patent Number: 5,000,818
[45] Date of Patent: Mar. 19, 1991

[54] METHOD OF FABRICATING A HIGH PERFORMANCE INTERCONNECT SYSTEM FOR AN INTEGRATED CIRCUIT

[75] Inventors: Michael E. Thomas, Cupertino; Jeffrey D. Chinn, Foster City, both of Calif.

[73] Assignee: Fairchild Semiconductor Corporation, Cupertino, Calif.

[21] Appl. No.: 525,958
[22] Filed: May 18, 1990

Related U.S. Application Data

[62] Division of Ser. No. 393,826, Aug. 14, 1989, Pat. No. 4,933,743.

[51] Int. Cl.$^5$ .................... B44C 1/22; C23F 1/02; C03C 15/00; C03C 25/06
[52] U.S. Cl. .................... 156/643; 156/644; 156/646; 156/653; 156/657; 156/659.1; 156/663; 437/192; 437/195; 437/199; 437/203; 437/228
[58] Field of Search ................ 357/67, 71; 156/643, 156/644, 646, 648, 652, 653, 655, 656, 657, 659.1, 663; 204/192.32, 192.37; 437/189, 190, 192, 194, 195, 197, 199, 203, 228, 235, 241, 245, 246

[56] References Cited

U.S. PATENT DOCUMENTS

| 3,846,166 | 11/1974 | Saiki et al. ............... 156/656 X |
| 4,451,326 | 5/1984 | Gwozdz ................... 156/656 X |
| 4,601,915 | 7/1986 | Allen et al. ............... 427/96 |
| 4,670,091 | 6/1987 | Thomas et al. ............ 156/656 X |
| 4,740,410 | 4/1988 | Muller et al. .............. 428/133 |

FOREIGN PATENT DOCUMENTS 0194950 9/1986 European Pat. Off. .
0239489 9/1987 European Pat. Off. .

OTHER PUBLICATIONS

Article entitled "A GaAs MSI 8-bit Multiplexer and Demultiplexer", by McCormack, et al, pp. 25–28, GaAs IC Symposium, publication No. CH1764–0/82/00-00-0025, 1982 IEEE.
Article entitled "A High Yield GaAs Array Technology-and Applications", by Rode et al, pp. 178–181, GaAs IC Symposium, publication No. Ch1876-2/83/0000-0178, 1983 IEEE.
Article entitled "Effects of Capacitance at Crossover Wirings in Power GaAs M.E.S.F.E.T.S", by Aono et al, pp. 417–418, Electronics Letters, May 22, 1980, vol. 16, No. 11.
Article entitled "Glass Reinforced GaAs Beam Lead Schottky Diode with Airbridge for Millimetre Wavelengths", by Mills et al, pp. 787–788, Electronics Letters, Sep. 13, 1984, vol. 20, No. 19.
Article entitled "Air-Bridge Microbolometer for Far-Infrared Detection", by Neikirk et al, pp. 153–155, American Institute of Physics, Appl. Phys. Lett 44(2), Jan. 15, 1984.
Article Entitled "Effects of Interconnections on Submicron Chip Performance", by Carter et al, pp. 63–68, VLSI Design, Jan. 1984.
Article entitled "Analysis of Crosstalk in Very High-Speed LSI/VLSI's Using a Coupled Multiconductor MIS Microstrip Line Model", by Seki et al, pp. 1948–1953, IEEE Transactions on Electron Devices, vol. Ed-31, No. 12, Dec. 1984.
Article entitled "Analysis of Interconnection Delay on Very High-Speed LSI/VLSI Chips Using an MIS Microstrip Line Model", by Hasegawa et al, pp. 1954–1960, IEEE Transactions on Electron Devices, vol. Ed-31, No. 12, Dec. 1984.
Article entitled "Plasma Planarization", Solid State Transactions, vol. 24, No. 4, Apr. 1981, A. C. Adams.

Primary Examiner—William A. Powell
Attorney, Agent, or Firm—Lee Patch; Michael A. Glenn; William H. Murray

[57] ABSTRACT

A semiconductor integrated circuit device includes a high performance interconnect structure which comprises a plurality of interconnects, with each interconnect being structurally separated from the remaining interconnects except at electrical contact points. In one embodiment, each interconnect is substantially surrounded by a layer of dielectric material, there being gaps between each adjacent layer of surrounding dielectric material. Another embodiment, a layer of electrically conductive material is formed over the surrounding dielectric layer preferably filling in the gaps between adjacent layers of surrounding dielectric material. The layer of electrically conductive material acts as a ground plane and heat sink.

29 Claims, 8 Drawing Sheets

METHOD OF FABRICATING A HIGH PERFORMANCE INTERCONNECT SYSTEM FOR AN INTEGRATED CIRCUIT

This is a divisional of copending application Ser. No. 07/393,826 filed on 8/14/89, now U.S. Pat. No. 4,933,743.

BACKGROUND OF THE INVENTION

The present invention relates generally to the construction of semiconductor integrated circuit devices and more particularly to systems for interconnecting devices in an integrated circuit.

As the device density in Very Large Scaled Integrated (VLSI) circuits increases, a number of problems concerning interconnect fabrication and functionality will be exacerbated. These trends not only require that the pitch of the metal, on any one level, is dramatically reduced but that the number of these tightly pitched metal levels increase. Design requirements of this nature will occur for high speed bipolar and MOS logic in mainframe computers and qate arrays with tens to hundreds of thousand of gates. Within the next decade, metal pitches approaching 2 microns will be commonplace with three to four levels of dense interconnect. Chips having an area of one square centimeter could potentially have tens to hundreds of meters of interconnect to effectively utilize all logic elements on the die.

To further complicate matters, the overall clock cycle of these circuits will eventually push well into the gigahertz range making these microwave integrated circuits. This will be especially true of state-of-the-art bipolar ECL devices. The wavelength of the signal propagating along the interconnects in many cases will approach the edge dimensions of the die making high speed interconnect coupling which is presently a problem on the printed circuit board level move on chip.

These requirements raise a number of interrelated problems. For example, the effective cross section of the interconnect will decrease unless the height to width ratios of the metal lines are increased. If the metal cross section is reduced without an equivalent fractional decrease in the current density or use of a physically more robust conductor, failure due to electromigration will become more probable. The thermal dissipation of energy generated by these larger devices during operation will also adversely affect the interconnect electromigration resistance. This will occur because the interconnects will be running at higher temperatures unless more efficient device cooling is employed. If the height of the interconnect is increased in tightly pitched structures, the capacitive and inductive coupling between adjacent interconnects in the same plane and planes above and below it also increases. These coupling effects lead to increased system noise and other spurious electrical effects which are detrimental to the performance of the integrated circuit.

In addition, as the speed of device operation increases, it will become necessary to match the overall circuit impedance with that of an external power source for optimal device efficiency with little reflected power. This will be especially true for VISI microwave circuits. A further problem will occur when the cross section of the interconnect is reduced. The resistance per unit length increases giving a large signal attenuation when the interconnect runs on chip are quite long (on the order of a centimeter).

In general, the ratio of inductance per unit length to capacitance per unit length will be more important from a designers viewpoint than the total inductance or capacitance alone. This ratio will effectively determine the characteristic impedance of the interconnect. Based on this situation, it is desirable to be able to "tune" the circuits for impedance mismatch caused by the L/C ratio obtained through design. This can be done for example by using stubs to match the circuit impedance with sources from the outside world. The attenuation and crosstalk issues, however, will continue to play a greater role in operational restrictions on very high speed circuits and must be addressed as a different issue.

In view of the above, it appears that it will be necessary to vertically increase the height/width ratio of the interconnect levels to maintain a low resistance and attenuation; effectively eliminate undesirable mutual coupling between the interconnects using a coaxial shielding approach; and match the device and source characteristic impedances by using stub tuning techniques on chip as a final fabrication step in the device processing.

Although the discussion has so far focused on the electrical requirements of the interconnect systems, it is important to appreciate other physical fabrication requirements. As devices and interconnect lines move closer together, mechanical flaws in the interconnect material can cause shorting between adjacent metal lines. This effect translates in device failure and a reduced die yield. Hillocking is one such mechanical flaw which can cause shorting. This phenomenon occurs due to thermally generated differential stresses between the interconnect and a support material which have substantially different thermal expansion coefficients. The flaw is manifested by random local deformation of conductor material in the form of bumps which protrude from the conductor surface. In some cases these bumps are large enough to short adjacent levels of wiring together resulting in the failure of a device. As the interconnect lines are moved closely together, such deformation is more likely to cause shorting of adjacent interconnect lines. This can become a severe problem especially when an encapsulating material, which can restrain this deformation, is not employed.

Consequently, there exists a need for an interconnect system wherein unwanted electrical coupling between interconnect lines can be minimized. Secondly, there exists a need to keep the resistance of the interconnect small by employing larger line cross sectional areas so attenuation losses are not appreciable and electromigration effects are avoided. In addition, it is desirable to find better ways to remove thermal energy from large high power devices during operation by using the interconnect, if possible. Finally, there exists a need for an interconnect system which, in addition to satisfying the above stated needs, also possesses superior mechanical strength at the required processing and device operational temperatures.

SUMMARY OF THE INVENTION

It is therefore an object of the present invention to provide a semiconductor integrated circuit structure having a high performance, high speed interconnect system.

It is another object of the present invention to provide an interconnect system for a semiconductor integrated circuit wherein the interconnects have improved electromigration resistance.

It is still another object of the present invention to provide an interconnect system for a semiconductor integrated circuit which can be used to extract thermal energy from the device during its operation.

It is still another object of the present invention to provide an interconnect system for a semiconductor integrated circuit which can be used to reduce unwanted electrical coupling between interconnect lines in close proximity to one another.

It is an additional object of the present invention to provide an interconnect system for a semiconductor integrated circuit, which interconnect system consists of coaxial lines.

It is yet another object of the present invention to provide an interconnect system for a semiconductor integrated circuit, which enables optimization of the characteristic impedance of the circuit.

It is still a further object of the present invention to provide an interconnect system for a semiconductor integrated circuit, which exhibits superior mechanical strength and hillock resistance.

It is still a further object of the present invention to provide an interconnect system for a semiconductor integrated circuit, which provides a common ground plane that is in close proximity to all interconnects in the device.

These and other objects which will become apparent are achieved in accordance with the present invention by providing an interconnect system in an integrated circuit, which system utilizes air as a dielectric between floating layers of multilevel metal interconnects. In one preferred method for fabricating such a system, a first dielectric layer, comprising a first dielectric material is formed over a completed semiconductor structure having devices formed therein. Contact holes are etched in the first dielectric layer, using a first etchant, in order to expose device contact areas. A contact hole is defined as a conduit for electrically connecting a metal interconnect layer to the semiconductor material. A first metal layer is formed over the structure into the contact holes, making contact with the device contact areas. The metal layer is then patterned and etched to form a first level of interconnects, using a second etchant which is substantially unreactive with the material of the underlying first dielectric layer. A second dielectric layer, comprising a second dielectric material, is formed over the first level of interconnects. The upper surface of the second dielectric layer is then planarized.

Vias holes are opened in the second dielectric layer utilizing a third etchant which reacts with the second dielectric material but is substantially unreactive with the underlying metal. A via hole is defined as a conduit for electrically connecting two metal interconnect levels. A second level of metal is then formed over the second dielectric layer into the via holes making direct electrical contact to the first level of interconnect. The second metal layer is then patterned and etched, using the second etchant, to form a second level of interconnects. Interconnect processing may be stopped at this point if only a second level of interconnects is required to complete the interconnect system. If a third or more levels of interconnects are required, a third dielectric layer is then formed over the second level of interconnects which is typically the same material used in the second dielectric layer with subsequent via hole formation, metal deposition and patterning. This process is repeated to generate multi-level interconnect structures having the desired number of interconnect levels.

After the processing of the interconnects has been completed, the complete device structure is placed in a third etchant which is reactive with the second dielectric material but is unreactive with the first dielectric material or metals used for the interconnect. As a result, all of the second dielectric material is removed from around the interconnects in the multi-level interconnect structure, leaving freely supported interconnect lines with air gaps therebetween.

If desired, a totally isolated interconnect structure, comprising coaxial interconnect lines is formed by placing the structure into a chemical vapor deposition system where a dielectric is deposited around the freely supported lines without filling the gaps in between the interconnect lines. Note that the process could be stopped at this point, leaving very small air gaps between lines which are fortified by the thick dielectric. This structure would greatly reduce the overall capacitance and increase the characteristic impedance of the interconnect if the design requires it. However, crosstalk between lines would still be possible. Such crosstalk is minimized by the structure of the present invention in which metal is deposited, preferably by chemical vapor deposition (CVD), in the gaps between the dielectric coated interconnect lines thereby forming a continuous metal encapsulent, which acts as a ground plane and heat sink, around the totally isolated interconnect structure.

In an alternative embodiment of the present invention, a layer of a first metal is formed over the structure and into the contact holes which have been formed in accordance with the above described procedure, the first metal layer making contact with device contact areas exposed by the contact holes. A layer of a second metal is then deposited over the first metal layer. The second metal layer is then patterned and etched to form a first post array, comprising a plurality of posts which are positioned on predetermined positions on the structure, using a second etchant which is substantially unreactive with the underlying first metal layer. The first metal layer is then patterned and etched to form a first level of interconnects, using a third etchant which is substantially unreactive with the second metal layer and the material of the underlying first dielectric material.

A thick layer of a second dielectric is formed over the posts in the first post array, the first level of interconnects and the first dielectric layer. The upper surface of the structure is planarized by, for example, forming a third dielectric layer over the second dielectric layer. The third and second dielectric layers are then etched back, using a third etchant, to expose the tops of the posts. Third and fourth metal layers are then deposited over the substantially planar upper surface of the second dielectric layer and into contact with exposed post tops. The third and fourth metal layers are then formed into a second interconnect level and second post array, respectively in accordance with the above procedure described above. This procedure can be repeated to generate multiple interconnect levels. The insulation between the interconnect lines is then removed as described above. Coaxial interconnect lines can then be constructed in accordance with the procedure also described above.

In another embodiment of the present invention, contact holes are formed in the first dielectric layer as described above. The contact holes can then be selectively filled with a first metal using chemical vapor deposition which makes the top metal surface in the contact holes planar with the top of the first dielectric surface. This process is called a plugged contact technology and the selectively deposited material is called a plug. The plugs make contact with the device contact areas exposed by the contact holes. A second layer of metal is then formed over the first dielectric layer and into contact with the upper surfaces of the plugs. The second metal is then patterned and etched to form a first level of interconnects using a second etchant which is substantially unreactive with the first metal which forms the plug and the underlying dielectric. A second dielectric material is formed over the first level of interconnects. The upper surface of the interconnects is then planarized.

Vias are opened in the second dielectric layer utilizing a third etchant which reacts with the second dielectric material but is substantially unreactive with the underlying second metal or the material of the first dielectric layer. A second array of plugs, comprising the first metal, are formed within the via holes in the second dielectric layer by selectively depositing the first metal into the vias until the upper surfaces of the deposited posts are substantially co-planar with the upper surface of the second dielectric layer. A layer of the second metal is then formed over the second dielectric layer into contact with the upper surfaces of the posts of the second plugged via array. The second metal layer is then patterned and etched to form a second level of interconnects using the second etchant. This procedure can be repeated to generate multi-level interconnect structures having the desired number of interconnect levels. The insulation between the interconnect lines is then removed as described above. Coaxial interconnect lines can then be constructed in accordance with the procedure also described above.

The interconnect levels alternatively can be formed using a layer of the first metal, that is the same metal as used to form the post or plugged via arrays. In this case, the layer of first metal is patterned with the interconnects forming caps or nests over the underlying posts or plugs in order to prevent their etching. The patterned first metal layer is then etched to form the interconnects using an etchant that is substantially unreactive with the underlying dielectric layer.

In another alternate, preferred embodiment, the interconnects can be formed of a sandwich structure comprising at least one layer of titanium sandwiched between two layers of aluminum-silicon material. The first layer of aluminum-silicon is formed over the underlying dielectric layer in contact with the top surfaces of the underlying post array. It is preferred that the top layer of aluminum-silicon is covered by a protective layer of tungsten. This sandwich structure is then patterned and etched to form the interconnects using an etchant which is substantially unreactive with the underlying post metal and dielectric layer. If an etchant is used which reacts with the underlying post metal, caps or nests are patterned into the interconnects to prevent etching of the underlying metal.

Other objects, features and advantages of the present invention will be more fully apparent from the following detailed description of the preferred embodiment, the appended claims and the accompanying drawings.

DETAILED DESCRIPTION OF THE PREFERRED EMBODIMENT

Figure 1A:
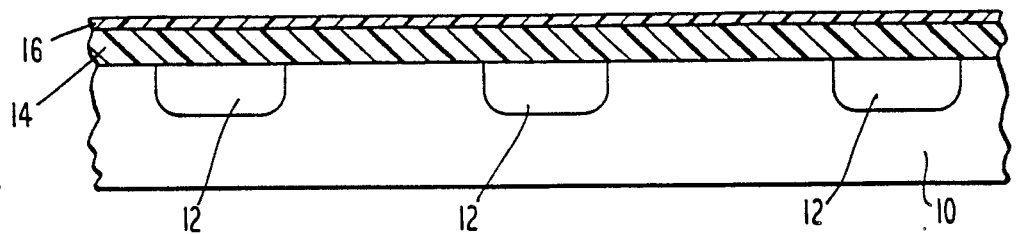
FIGS. 1A–1M are diagramatic cross-sectional representations of the processing stages of a preferred method for constructing a device in accordance with the present invention.

Although specific forms of the invention have been selected for illustration in the drawings, and the following description is drawn in specific terms for the purpose of describing these forms of the invention, this description is not intended to limit the scope of the invention which is defined in the appended claims.

Referring now to FIG. 1 and particularly to FIG. 1A, there is shown in diagramatic cross-sectional form, a completed semiconductor structure 10 comprising a silicon substrate in which devices such as transistors and diodes have been formed. Such devices are depicted diagramatically and are identified by the reference numeral 12. A first dielectric layer 14 is formed over the completed semiconductor 10. In the preferred embodiment, the dielectric layer 14 comprises silicon dioxide which is formed during a low pressure chemical vapor deposition process (LPCVD). A reactive Mixture of $SiH_4 + PH_3 + O_2$ is used to generate glass thicknesses from 2000A to 6000A. An etch stop dielectric layer 16, which is impervious to a first etchant (to be described subsequently), is formed over the first dielectric layer 14. In the preferred embodiment, the etch stop dielectric layer 16 comprises silicon nitride, which is substantially impervious to a first etchant comprising a dilute or buffered hydrogen fluoride (HF) solution. The etch stop dielectric layer 16 is preferably formed by low pressure chemical vapor deposition to a thickness of approximately 4000A. This layer provides good adhesion of the first metal layer with the substrate during a long exposure wet etch which is used to suspend other metal levels in free space as will be subsequently described.

Figure 1B:
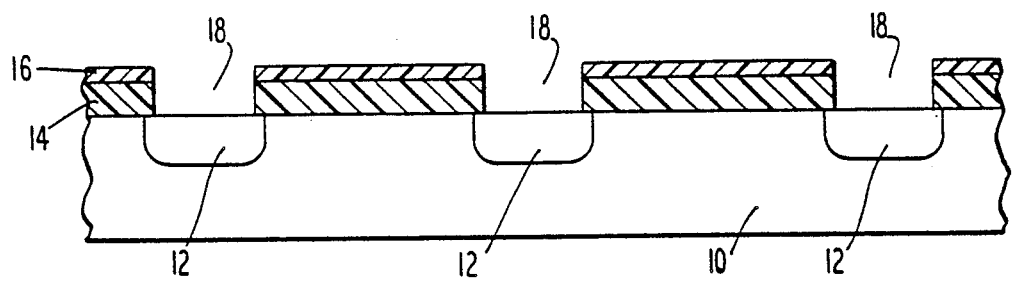
Figure 1C:
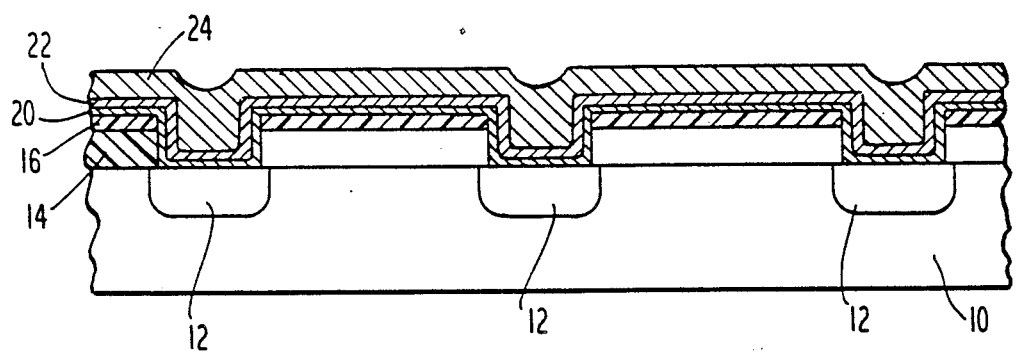

Referring now to FIG. 1B, contact holes 18 are etched in the etch stop dielectric layer 16 and first dielectric layer 14 in predetermined spaced relation to the device regions 12 in order to expose contact areas to associated underlying regions 12. In the preferred embodiment, the holes 18 are etched using a plasma RIE process with a second etchant, preferably $CHF_3$ and oxygen. In the preferred embodiment, a first electrically conductive adhesion layer 20 is then formed over the structure and into the contact holes 18 in contact with the device contact areas. It is preferred that the first adhesion layer 20 comprise a thin (50 to 100A) titanium layer which is formed by physical vapor deposition (PVD) or sputtering and which provides good contact and adhesion to the semiconductor structure 10. The use of this layer is applicable to high temperature interconnects, such as tungsten, and is not necessary with the lower temperature structures to be described subsequently. This layer will partially coalesce after high temperature processing and provides good adhesion to the dielectric. It should be noted that if a process with good tungsten adhesion is employed, it would then be possible to eliminate the titanium adhesion layer. A first electrically conductive barrier layer 22 is formed over the first adhesion layer 20. The first barrier layer 22 preferably comprises tantalum nitride (TaN), for example, which is formed by sputtering tantulum in a reactive environment of 70% Ar(g)+30% N₂(g), to a thickness of approximately 500A. In an alternate preferred embodiment, the barrier layer 22 comprises zirconium boride (ZrB₂) which is formed by the reactive deposition of Zr and B. A first metal layer 24 is then formed over the first barrier layer 20. In the preferred embodiment, the first metal layer 24 comprises tungsten which is formed by a Chemical Vapor Deposition (CVD) process to a thickness of approximately 0.75 micron.

Figure 1D:
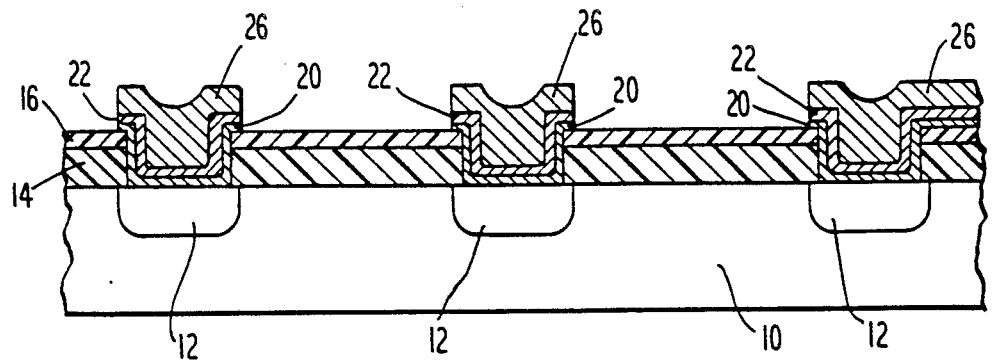

The first metal layer 24 is patterned with photoresist, in accordance with a predetermined first level interconnect pattern, then anisotropically etched, utilizing a plasma RIE process with a third etchant, preferably SF₆, which stops at the etch stop dielectric layer 16 as shown in FIG. 1D. The third etchant SF₆, reacts with the materials of the adhesion, barrier and first metal layers, 20, 22 and 24 respectively, but more slowly attacks the etch stop dielectric layer 16. Note that attack can occur; however, the dielectric layer 16 is thick enough and the attack is slow enough that the layer 16 remains continuous even after overetch. At this point, a first level of interconnects 26 has been formed and all surfaces of the silicon dioxide material comprising the first dielectric layer 14 have been covered either by the etch stop layer dielectric 16 or the material in the contact holes 18.

Figure 1E:
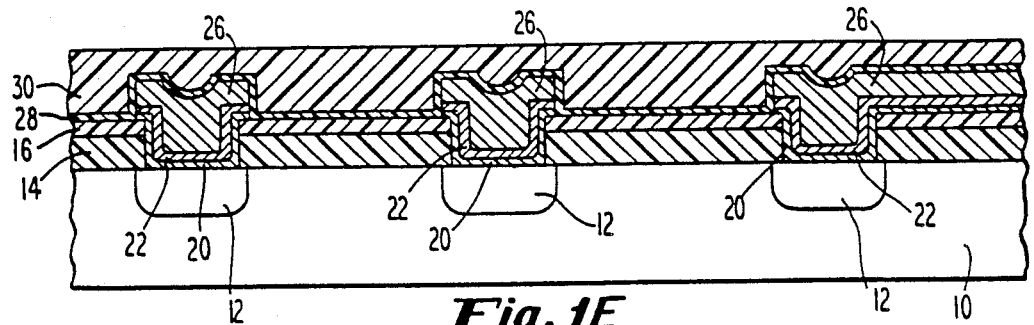

The structure of FIG. 1D is then covered with a first protective dielectric layer 28 as shown in FIG. 1E. In the preferred embodiment, the first protective layer 28 is a thin layer of sputtered quartz, having a thickness of approximately 500A, which protects the underlying tungsten from oxidation during formation of an overlying second dielectric layer 30. The second dielectric layer 30 preferably comprises a 1 micron thick film of reflow glass, such as a germanophosphosilicate glass which is formed over the protective layer 28 by atmospheric CVD deposition from a mixture of SiH₄+PH₃+GeH₄+O₂. After formation, the glass is reflowed at 950° C. to form a substantially planar upper surface. Other glasses with low reflow temperatures, such as borophosphosilicate glasses which reflow at 850° C., can also be used. For processes where high temperature reflow planarization cannot be tolerated, low temperature oxides and etch back planarization can be used as an alternative. Such an alternative is useable whenever the generation of planar dielectrics is required in the method described and claimed herein; and is therefore considered to be within the scope and contemplation of the present invention. This system is stable with the silicon areas in the contact regions since the TaN barrier layer 22 inhibits silicon and dopant diffusion from these regions.

Figure 1F:
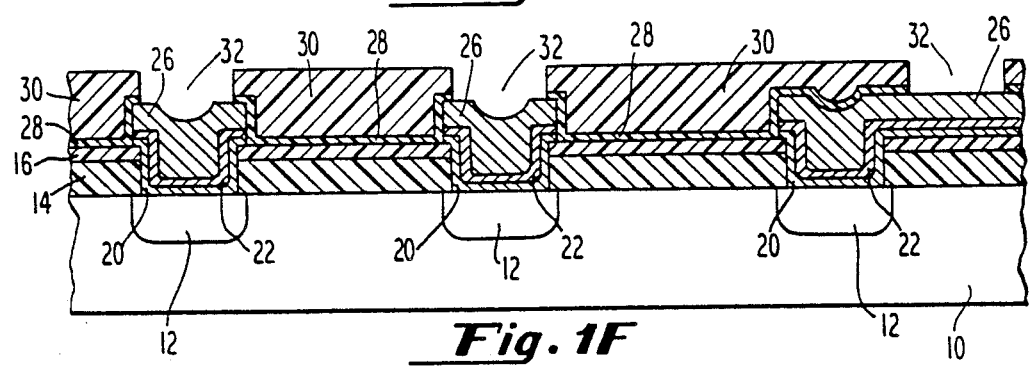

As shown in FIG. 1F, vias 32 are opened in the planarized dielectric layer 30, preferably using photolithography to define an etch mask, then etching the openings using plasma RIE with CHF₃ and oxygen. The via openings 32 are formed in spaced relation to the underlying first level of interconnects 26 thereby exposing predetermined contact regions thereon. Since the tungsten metallization of the first level of interconnects 26 does not form a stable oxide, it can be wet dipped in a dilute (for example 100:1) water:peroxide (H₂O:H₂O₂) solution prior to metal deposition. This substantially enhances the reliability of the contacts since there is not a stable oxide which inhibits good electrical interconnection between metal layers.

Figure 1G:
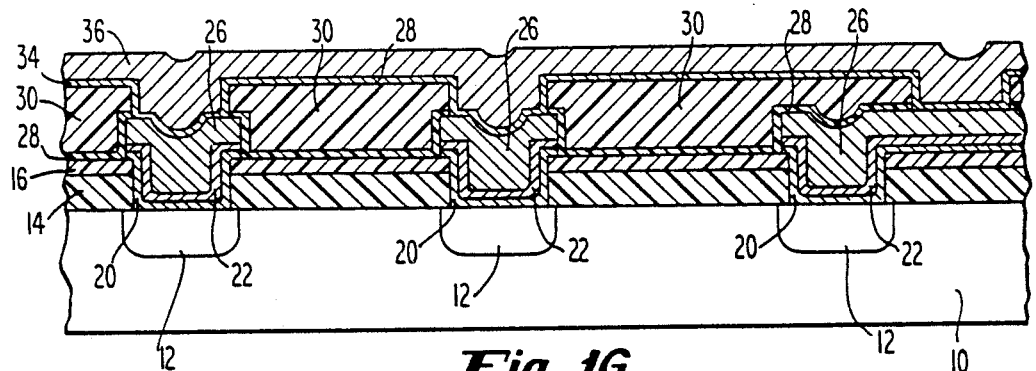

As shown in FIG. 1G, a second adhesion layer 34 is deposited over the second dielectric layer 30 into the via openings 32, in contact with the contact regions on the first level of interconnects level. In the preferred embodiment, the second adhesion layer 34 comprises titanium which has been formed by physical vapor deposition (PVD) to a thickness on the order of 50 to 100A. A second metal layer 36 is then deposited over the second adhesion layer 34. The second metal layer 36 preferably comprises tungsten which is formed by chemical vapor deposition (CVD) to a thickness of approximately 7500A. It should be noted again that if a process with good tungsten adhesion is employed, it would then be possible to eliminate the tungsten adhesion layer 34. The via openings 32 can be filled with metal using the method subsequently described for filling contacts.

Figure 1H:
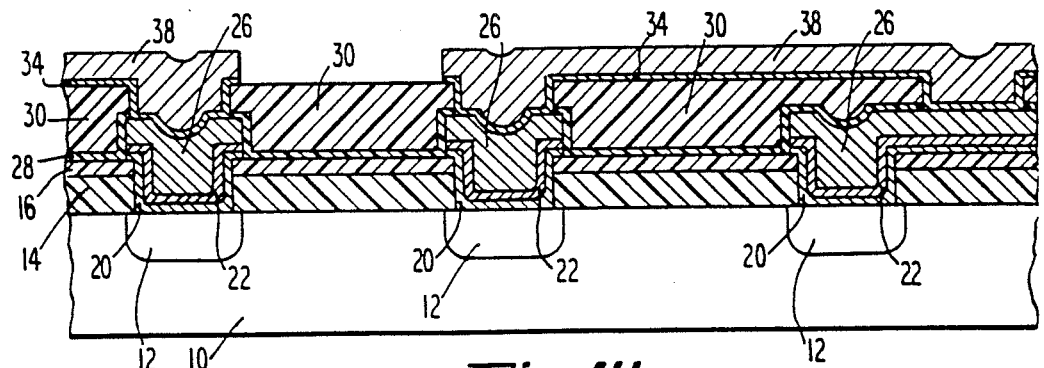
Figure 1I:
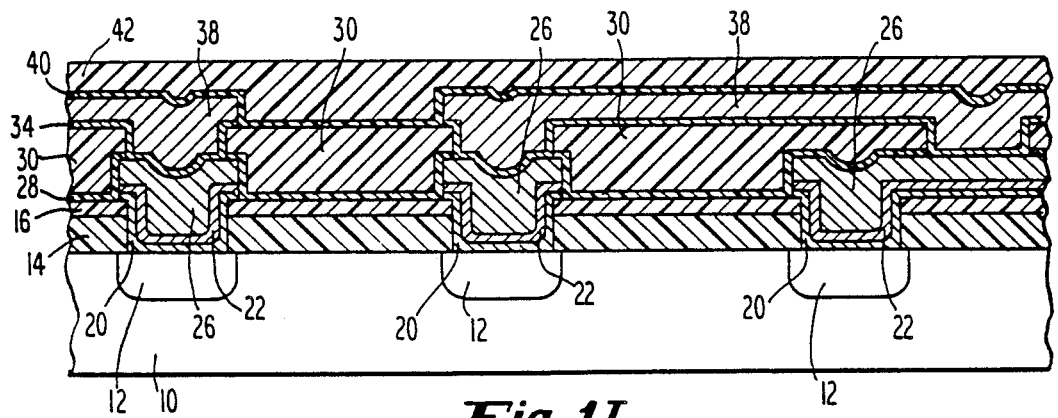

The second metal layer 36 and underlying second adhesion layer 34 are then patterned using photolithographic masking techniques and etched, using plasma RIE with SF₆ to form a second level of interconnects 38 as shown in FIG. 1H. This structure is then covered with a second protective dielectric layer 40 and a third dielectric layer 42 as shown in FIG. 1I. The second protective layer 40 is preferably a thin layer of sputtered quartz having a thickness of approximately 500A which protects the underlying tungsten material from oxidation during deposition of the overlying third dielectric layer 42. The third dielectric layer 42 is preferably a thick film having a thickness of approximately 1.2 um of a reflow glass such as a germanophosphosilicate glass which is formed by atmosperic CVD reaction of SiH₄+PH₃+GeH₄+O₂. The glass is then reflowed at 950° C. in order to provide a substantially planar upper surface. Other glasses with low reflow temperatures, such as borophosphosilicate glasses which reflow at 850° C., can also be used. For processes where high temperature reflow planarization cannot be tolerated, low temperature oxides and etch back planarization can be used as an alternative as previously stated.

Figure 1J:
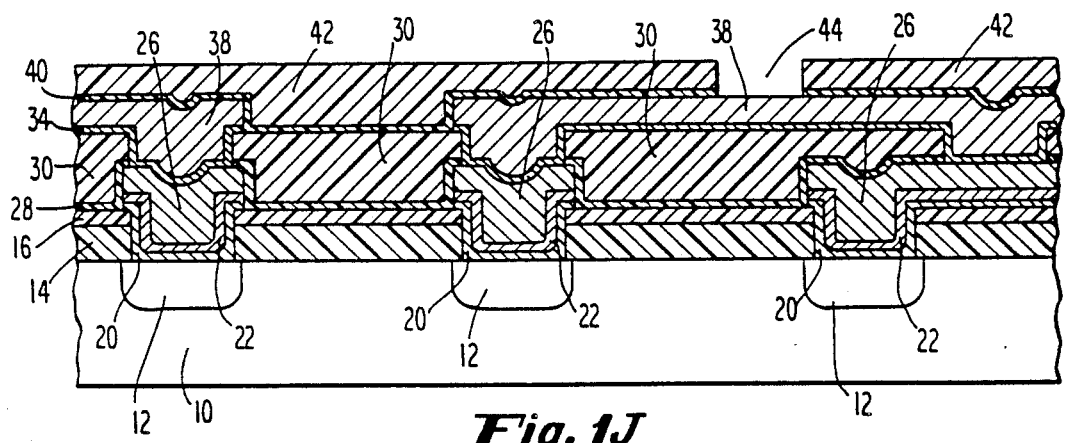

A second set of vias 44 are then formed in the third dielectric layer 42 and second protective layer 40, in predetermined spaced relation with the underlying second level of interconnects 38 as shown in FIG. 1J. In the preferred embodiment, the second set of via openings 44 are formed in accordance with the method set forth above with respect to the first set of via openings 32. The second set of via openings 44 expose contact regions at predetermined locations on the underlying second level of interconnects 38.

Figure 1K:
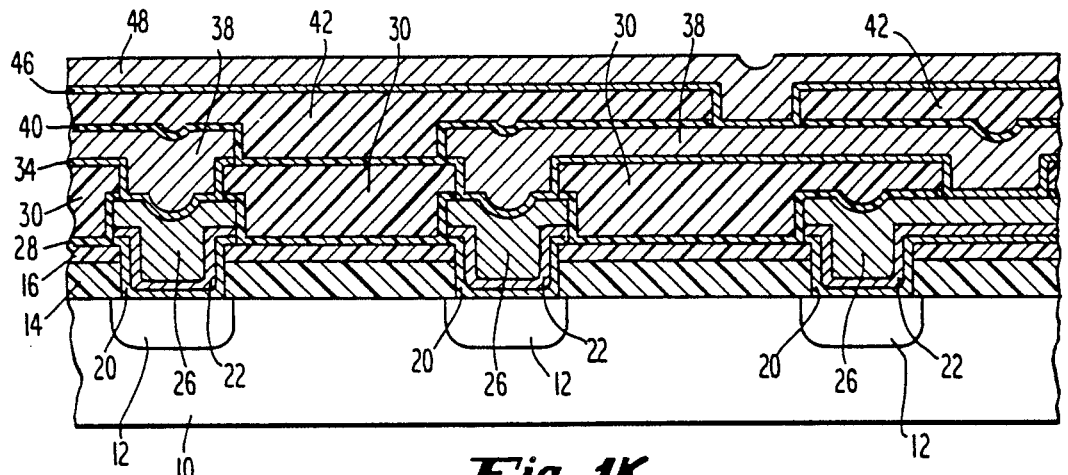
Figure 1L:
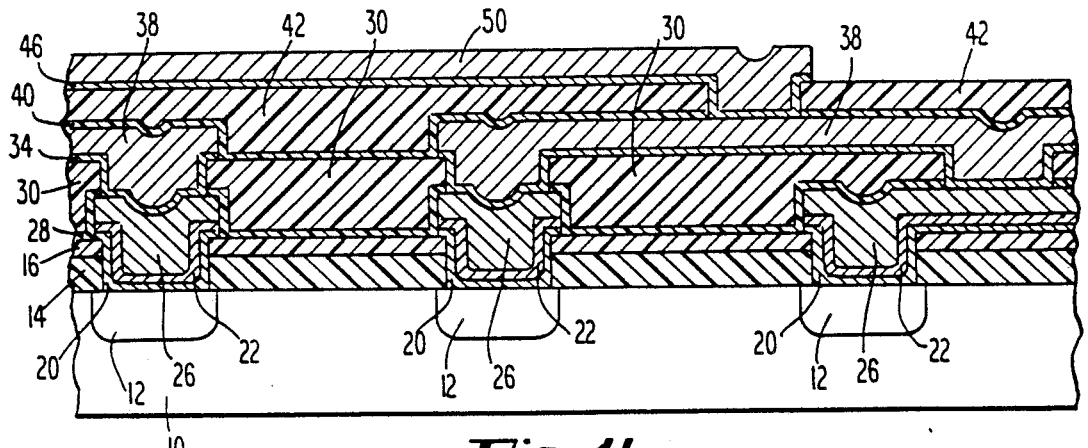

As shown in FIG. 1K, a third adhesion layer 46 is then formed over the third dielectric layer 42 into the second set of via openings 44 in contact with the exposed contact regions on the second level of interconnects 36. In the preferred embodiment, the third adhesion layer 46 comprises titanium which is formed by physical vapor deposition (PVD) sputtering to a thickness preferably on the order 50 to 100A. A third metal layer 48 is then formed over the third adhesion layer 46. The third metal layer is preferably tungsten which is formed by chemical vapor deposition (CVD) to a thickness of approximately 7500A. As previously stated, if a process with good tungsten adhesion is employed, it is possible to eliminate the titanium adhesion layer. The third adhesion layer 46 and third metal layer 48 are then patterned and etched, using the process previously described with respect to the formation of the second level of interconnects 38, to form a third level of interconnects 50 as shown in FIG. 1L. This process for forming additional interconnect levels can be repeated as desired to generate multi-level interconnect structures.

After the desired number of interconnect levels have been fabricated, the wafer is then submerged in the first etchant which attacks the material of the insulating layers between the interconnect levels. In the embodiment depicted in FIG. 1L, these are layers 30 and 42. As previously stated, this first etchant is a hydrogen fluoride (HF) bearing solution which removes the germanophosphosilicate glass and sputtered $SiO_2$ insulating material between all of the metal layers resulting in the structure depicted in FIG. 1M. The preferred etchant consists of a mixture of 3:3:2 parts ammonium fluoride: acetic acid: water.

Figure 1M:
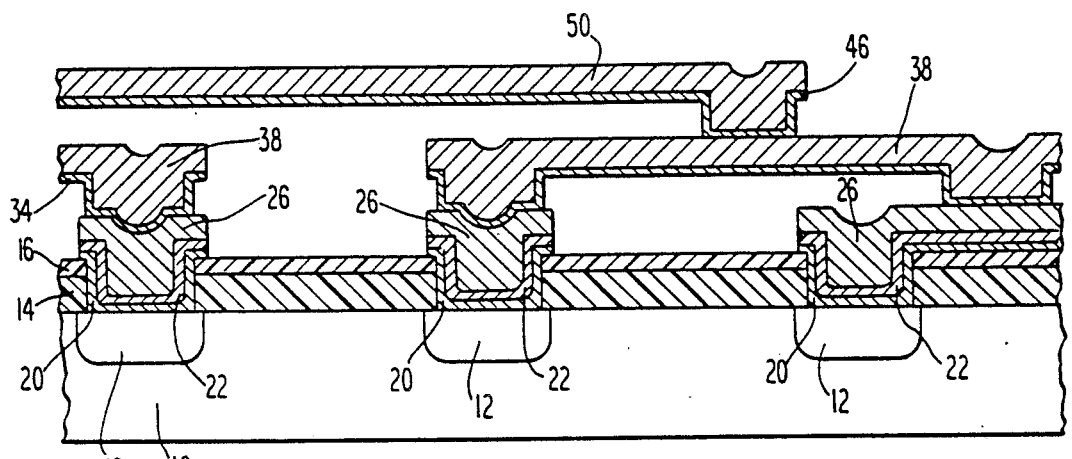
Figure 2B:
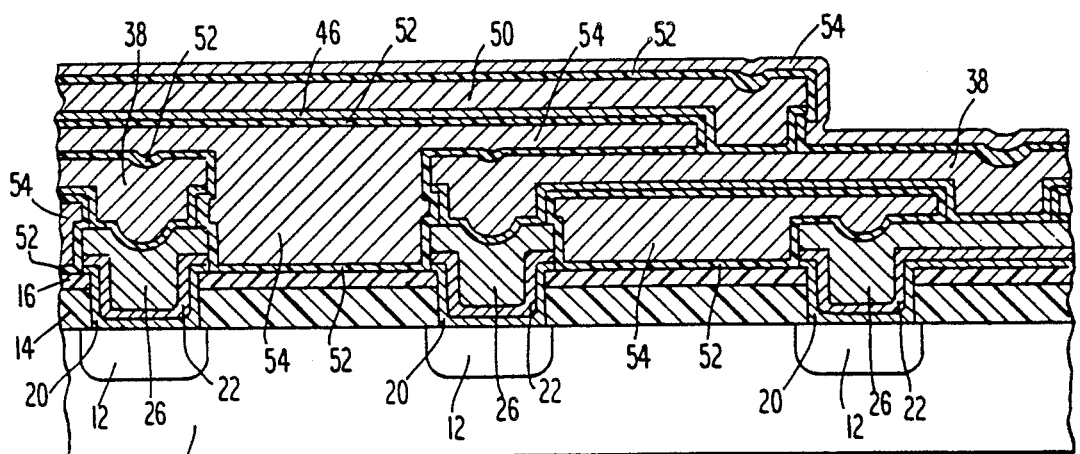
FIGS. 2A and 2B are diagramatic cross-sectional representations depicting the formation of coaxial interconnect lines in accordance with the present invention.
Figure 2A:
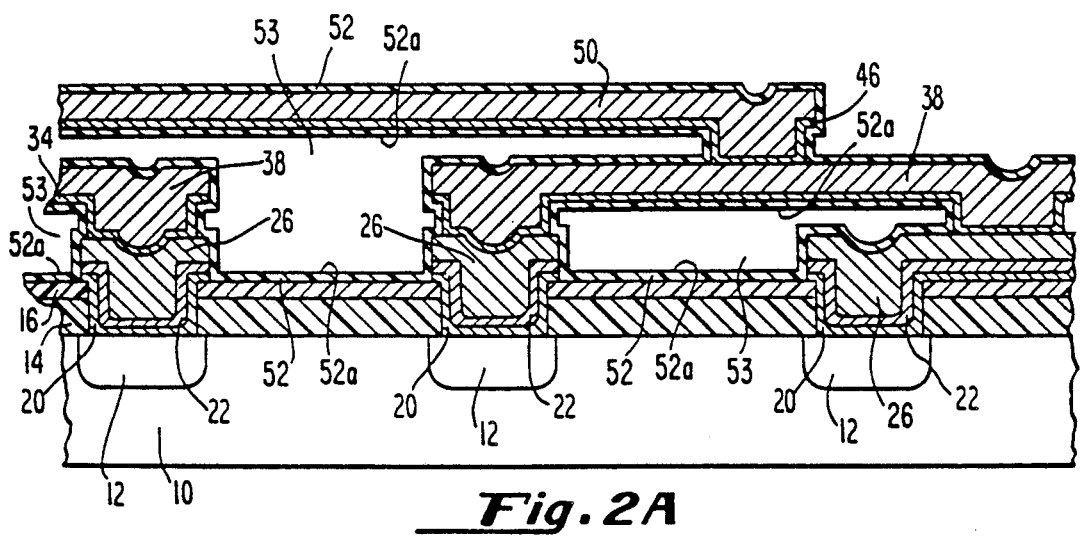

To form coaxial interconnect lines, a layer of insulation 52 is formed around the freely supported interconnect lines of the structure depicted in FIG. 1M without filling in the gaps 53 therebetween. The layer of insulation 52 is as thick as is reasonably necessary to ensure that gaps 53 are retained between the interconnect levels. In the preferred embodiment, the insulating layer 52 comprises silicon dioxide which is deposited using a chemical vapor deposition (CVD) system to a thickness of 3000Å. FIG. 2A shows a cross sectional representation of layer 52 thus surrounding freely supported interconnect lines wherein layer 52 is a continuous layer coating the surfaces of the interconnect lines which are exposed when layers 30, 42 are removed. Layer 52 has inner surfaces in contact with the surfaces of the interconnect lines which were exposed prior to deposition of layer 52. Additionally, layer 52 has opposing outer surfaces 52a which are surrounded by air gaps 53 and separated by air gaps 53 from the outer surfaces 52a of other portions of layer 52. After completing the formation of the insulating layer 52, a layer 54 of electrically conductive material, such as tungsten, is formed over the insulating layer 52. It is preferred that this conductive layer 54 is formed by CVD deposition of tungsten around the gaps 53 over the insulating layer 52 thereby forming a continuous metal encapsulent around the totally isolated interconnect structure. Although gaps may be left between portions of the conductive layer 54 which surround adjacent interconnects, it is preferred that all such gaps are filled with metal thereby enhancing the mechanical strength of the structure. The completed structure described above is shown in FIG. 2B.

This metal layer 54 can then act as a ground plane around all of the lines where it will be able to sink the field lines emanating from interconnect lines in close proximity, thereby greatly reducing their cross talk. In addition, the metal layer 54 can also function as a heat sink. Contact pads are then cleared of metal and dielectric and the wafer is diced. Die are then packaged for die bonding. One connection to the metal layer 54 should provide close ground to all of the interconnects in the semiconductor structure. Other physical connections to the top surface of the device can be used to extract heat in the chip up through the interconnect layers.

Figure 3A:
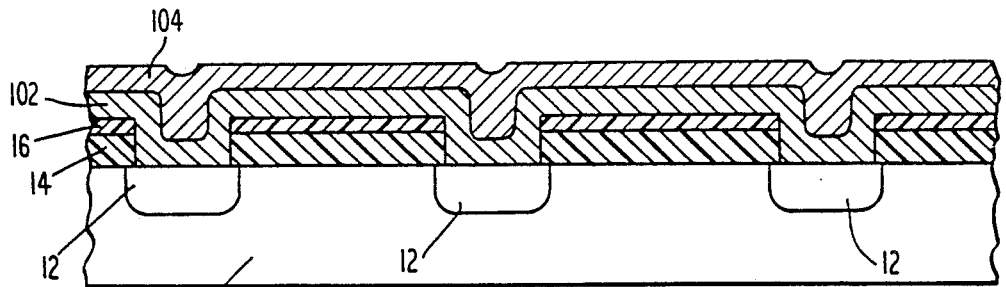
FIGS. 3A–3H are diagramatic cross-sectional representation of the processing stages of an alternate preferred method for constructing a device in accordance with the present invention.

In an alternate preferred embodiment of the present invention, contact holes 18 are formed in a first dielectric layer 14 and a first etch stop dielectric layer 16 over contact areas of devices 12 in the semiconductor structure 10, as previously described in conjunction with FIGS. 1A and 1B. After formation of the contact holes 18, a first electrically conductive layer 102, comprising a first metal, is formed over the structure and into the contact holes 18 as shown in FIG. 3A. In the preferred embodiment, the first electrically conductive layer 102 comprises aluminum which is formed to a thickness of approximately 4500Å by physical sputtering. Thereafter, a second electrically conductive layer 104, comprising a second metal, is formed over the first electrically conductive layer 102. In the preferred embodiment, the second electrically conductive layer 104 comprises tungsten which is formed to a thickness of approximately 7500Å by physical vapor deposition (PVD) or sputtering.

Figure 3B:
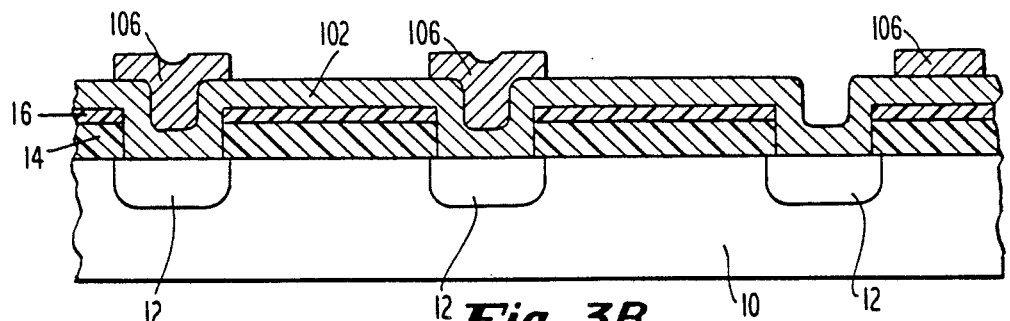
Figure 3C:
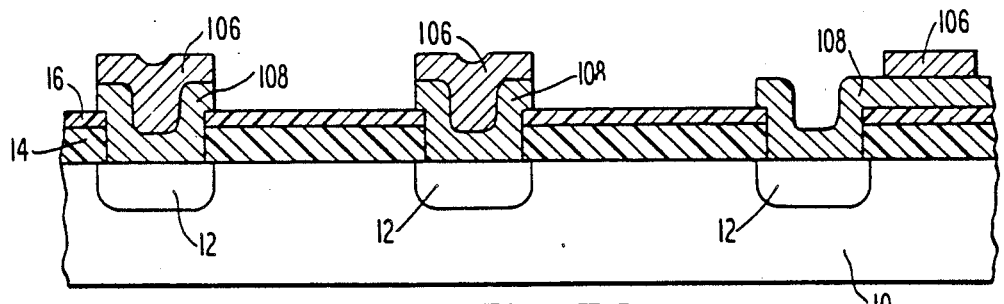

Referring now to FIG. 3B, the second electrically conductive layer 104 is patterned into first array of posts 106 utilizing conventional photoresist techniques and an etchant which reacts with the second metal but is substantially unreactive with the first metal. The posts 106 are metal features which protrude substantially above the electrically conductive layer 102 and which provide an electrical connection to the next metal level. In the preferred embodiment, the etching process used is plasma RIE with $SF_6$. Consequently, the first array of posts 106 are formed with the etch stopping on the first electrically conductive layer 102. The first electrically conductive layer 102 is then patterned into a first level of interconnects 108 utilizing conventional photoresist techniques and an etchant which reacts with the first metal but which is substantially unreactive with the second metal and with the first etch stop dielectric layer 16. Consequently, the first level of interconnects 108 is formed with the etchant stopping at the first etch stop dielectric layer 16 and with the posts 106 of the first post array acting as masks against etching the underlying first metal regions. As a result, the posts 106 are self aligned with respect to the underlying first level of interconnects 108 as shown in FIG. 3C.

Figure 3D:
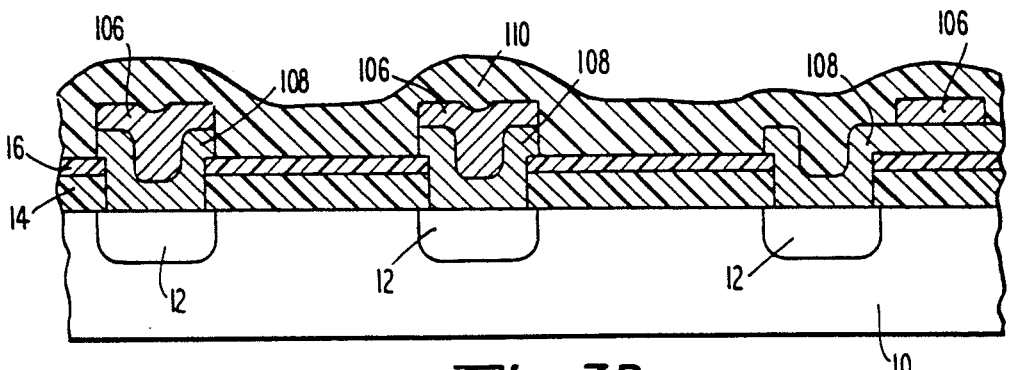
Figure 3E:
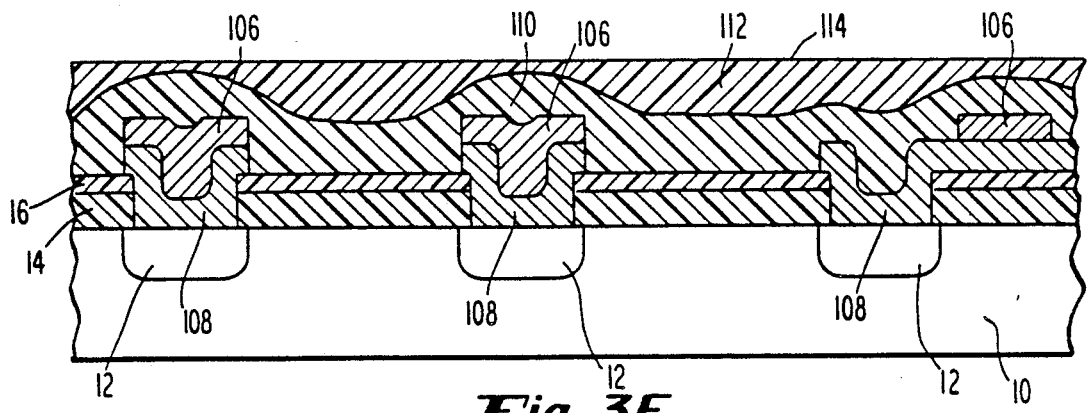
Figure 3F:
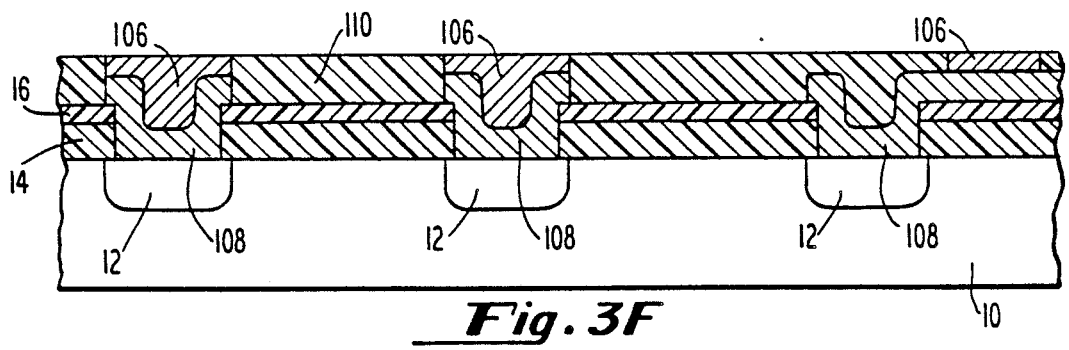

Referring now to FIG. 3D, a thick second dielectric layer 110 is formed over the posts 106 and the first level of interconnects 108 as well as over the first etch stop dielectric layer 16. In the preferred embodiment, the second dielectric layer 110 comprises a low temperature oxide which is deposited to a thickness of approximately 2 microns using low pressure chemical vapor deposition (LPCVD) of $SiH_4$, $PH_3$ and oxygen. As shown in FIG. 3E, a planarizing dielectric layer 112 is then formed over the second dielectric layer 110. In the preferred embodiment, the planarizing dielectric layer 112 is preferably a photoresist organic resin which is spun over the second dielectric layer 110 in order to form a substantially planar upper surface 114. The planarizing dielectric layer 112 and second dielectric layer 110 are then etched back, preferably using plasma RIE with $CHF_3+O_2$, to expose the tops of the posts 106 while maintaining a substantially planar upper surface as shown in FIG. 3F. At this point, it is preferred that the structure be dipped into a hydrogen peroxide:-water solution (1:20) to clear the exposed upper surfaces of the posts 106 of native oxide which could degrade electrical contact thereto.

Figure 3G:
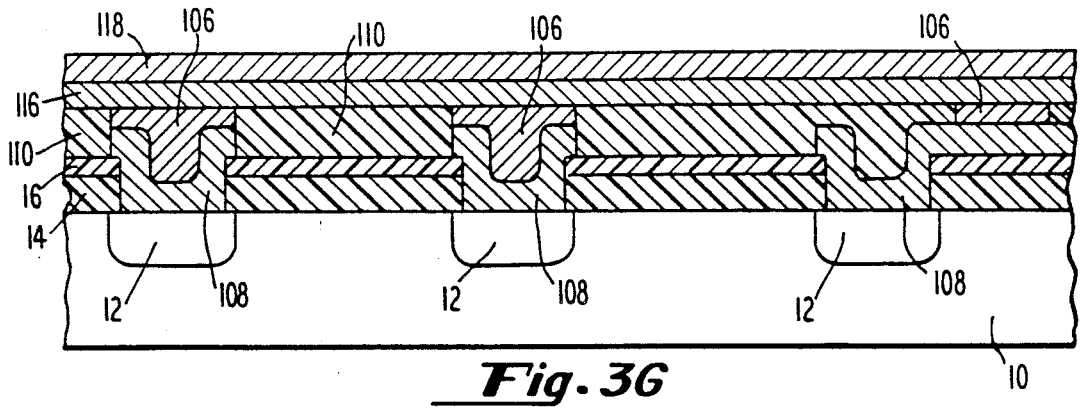
Figure 3H:
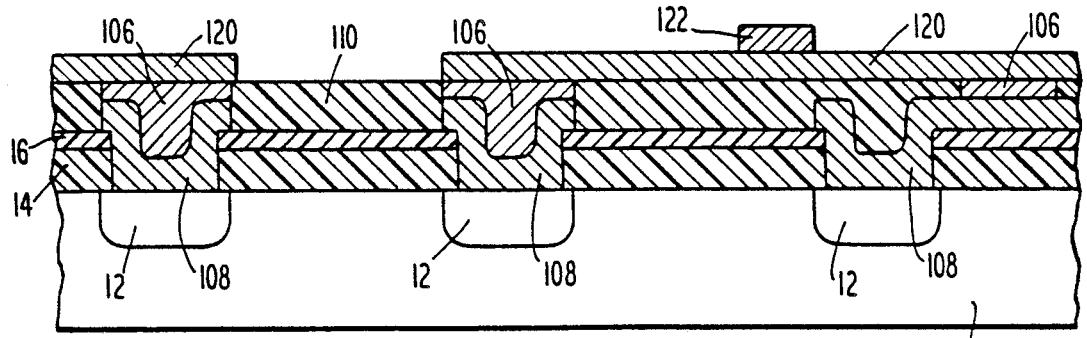

As shown in FIG. 3G, a third electrically conductive layer 116, comprising the first metal which is aluminum in the preferred embodiment, is then formed on the planarized upper surface of the second insulating layer 110, into contact with the exposed tops of the posts 106.

A fourth electrically conductive layer 118 comprising the second metal which is tungsten in the preferred embodiment, is then formed over the third electrically conductive layer 116. The third and fourth electrically conductive layers ar formed in accordance with the procedure described above with respect to the formation of the first 102 and second 104 electrically conductive layers. The third 116 and fourth 118 electrically conductive layers can then be formed into a second level of interconnects and a second array of via posts respectively in accordance with the procedure described above with respect to the formation of the first level of interconnects 108 and the first array of posts 106.

A third insulating layer may then be formed over the second level of interconnects and second array of posts planarized and etched back to expose the tops of the posts in the second array, in accordance with the procedure described above in conjunction with FIGS. 3D through 3F. These processing steps may be repeated until the desired number of interconnect levels have been formed. Subsequently, the insulating material between the interconnect lines is removed in accordance with the procedure set forth above in conjunction with FIG. 1M. Thereafter, coaxial lines can be formed as described above in conjunction with FIG. 2.

Figure 4A:
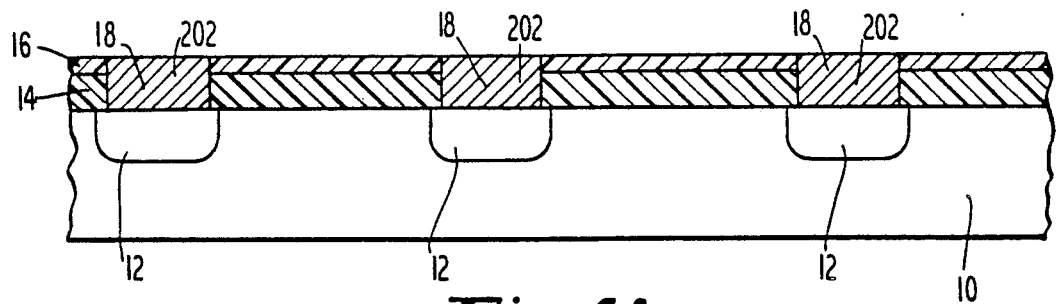
FIGS. 4A–4D are diagramatic cross-sectional representations of the processing stages of among alternate preferred method for constructing a device in accordance with the present invention.
Figure 4B:
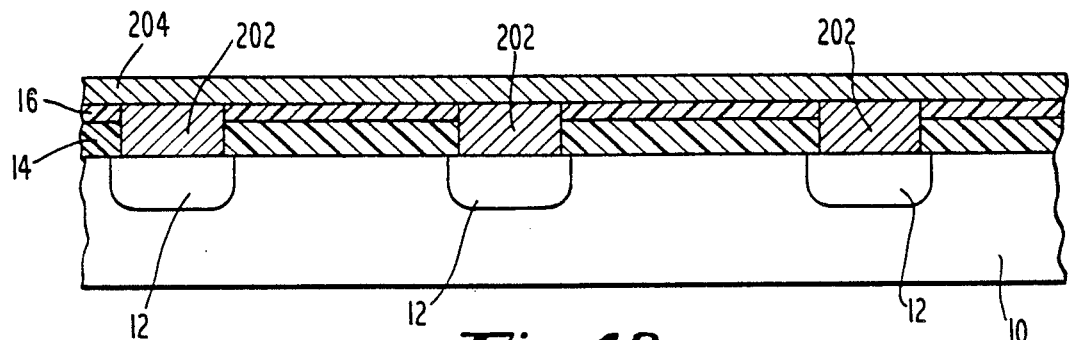

In yet another alternate preferred embodiment of the present invention, contact holes 18 are formed in a first dielectric layer 14 and a first etch stop dielectric layer 16 over contact areas of devices 12 in the semiconductor structure 10, as previously described inconjunction with FIGS. 1A and 1B. After formation of the contact holes 18, plugs 202 comprising a first metal, preferably tungsten, are formed within the contact holes 18 as shown in FIG. 4A. The plugs 202 are formed by selectively depositing the first metal into the contact holes 18, preferably using chemical vapor deposition (CVD). In the preferred embodiment, tungsten is used as the first metal and is deposited in a cold wall reactor. The substrate temperature of the wafer is held between 300° C. and 600° C. with the selective tungsten deposition occurred by using a $WF_6:H_2$ ratio of approximately 1:100. The deposition process is allowed to proceed until the upper surfaces of the deposited posts 202 are substantially coplanar with the upper surface of the first etch stop dielectric layer 16 as shown in FIG. 4A. A first metal layer 204 is then formed over the first etch stop dielectric layer 16 into contact with the upper surfaces of the posts 202. The first metal layer 204 preferably comprises tungsten or an aluminum silicon titanium sandwich alloy structure as subsequently described.

Figure 4C:
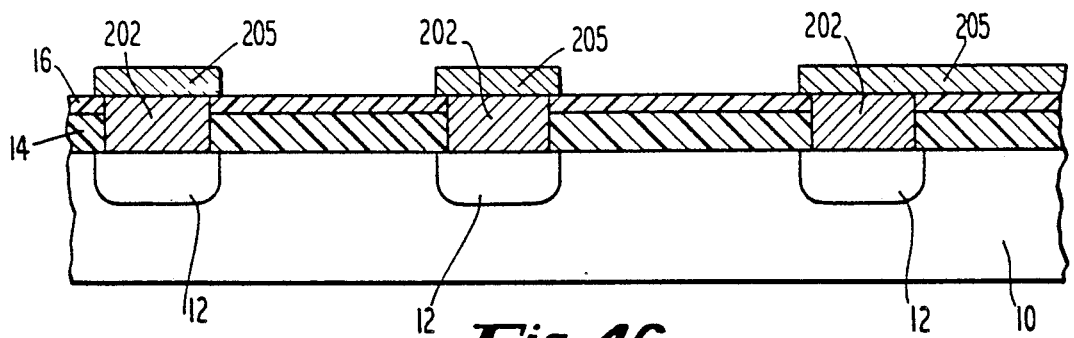
Figure 4D:
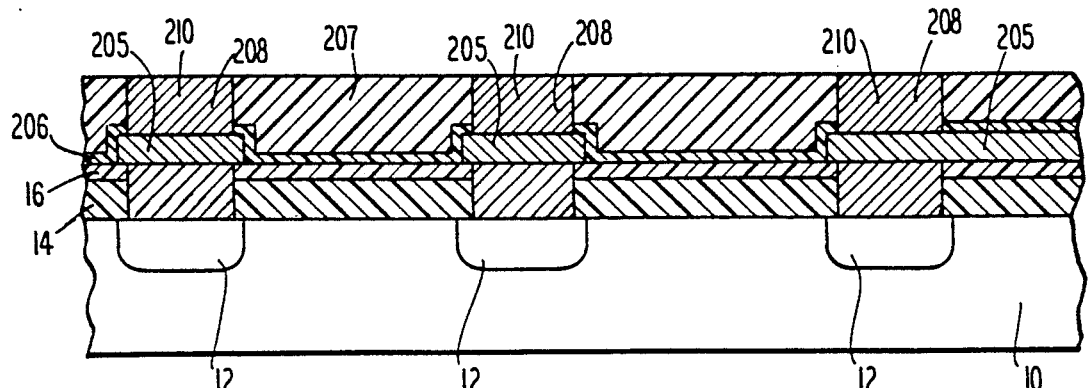

The first metal layer 204 is patterned into a first level of interconnects 205 (see FIG. 4C) utilizing conventional photoresist techniques and a etchant which reacts with the material of the first metal layer but is substantially unreactive with the material of the underlying first etch stop dielectric layer 16 As shown in FIG. 4D, a first protective layer, 206 is formed over the first level interconnects 205 as well as the first etch stop dielectric layer 16 as previously described in conjunction with FIG. 1E. A planarized layer 207 of dielectric material is formed over the first protective layer as also previously described with respect to FIG. 1E. However, since aluminum alloys are being utilized in this alternate preferred embodiment of the present invention, the low temperature oxide and etch back planarization alternative, previously described, must be used for planarization. A second set of vias 208 are opened in the planarized dielectric layer 207 and underlying protective layer 206 preferably in accordance with the procedure previously described with respect to FIG. 1F. A second array of posts 210, comprising the first metal, are formed within the vias 208 in accordance with the procedure previously described with respect to FIG. 4A.

A layer of the second metal can then be formed over the second dielectric layer 207 into contact with the upper surfaces of the posts 210 of the second post array. The second metal layer is then patterned and etched to form a second level of interconnects using the second etchant. This procedure can be repeated to generate multi-level interconnect structure having the desired number of interconnect levels. The insulation between the interconnect lines is then removed a described above with respect to 1M. Coaxial interconnect lines can then be constructed in accordance with the procedure described above with respect to FIG. 2.

For lower temperature applications, that is, where processing and practical operating temperatures do not exceed 500 degrees Centigrade, the interconnects previously described can be replaced with an aluminum-silicon/titanium sandwich structure. Since aluminum is used in the sandwich structure, the low temperature oxide and etch back planarization alternative, previously described, must be used to accomplish the planarization steps required in accordance with this alternative preferred embodiment of the present invention. The sandwich structure comprises a first layer of an aluminum-silicon material which preferably is 1% to 1.5% silicon by weight. The first aluminum-silicon layer is preferably approximately 2500A thick. A first titanium layer is formed over the first aluminum-silicon layer preferably to a thickness in a range of approximately 50A to 200A. At least a second aluminum-silicon layer is formed over the first titanium layer, preferably to a thickness of approximately 2500A.

Although the sandwich structure comprises at least a first titanium layer sandwiched between at least a first and a second aluminum-silicon layer, in the preferred embodiment a second titanium layer is formed over second aluminum-silicon layer to a thickness preferably in a range of approximately 50A to 200A. In addition, a third aluminum-silicon layer is formed over the second titanium layer preferably to a thickness of approximately 2500A. The composition of the second and third aluminum-silicon layers is also preferably 1% to 1.5% silicon by weight. Finally, a protective layer, preferably comprising tungsten, is formed over the third aluminum-silicon layer preferably to a thickness of approximately 1000A. This sandwich structure is then patterned and etched to form the desired interconnects using methods available to those skilled in the art.

Utilizing the sandwich structure described above substantially reduces the problem of interconnect deformation such as hillocking, and resulting electrical shorts between interconnects, because the silicon in the aluminum-silicon material migrates to the titanium interface to form a ternary phase. Because of its superior mechanical strength properties over pure aluminum or standard aluminum alloys containing Cu this sandwich structure enables the use of aluminum as the primary material for the interconnects. This is desirable due to the fact the resistance is substantially lower than that of the other materials which do not exhibit hillocking, such as tungsten. Furthermore, due to its relatively low electrical resistance properties, aluminum is less likely to cause voltage drops which affect device switching levels when compared to other high strength materials such as tungsten. Since aluminum is the principal material of the sandwich structure and particularly of the top layer, the protective tungsten layer is desirable to prevent the formation of native oxides on the upper surface of the aluminum-silicon layer. The presence of such native oxides could cause the formation of bad electrical contacts between the interconnects and any plugs which are formed above the sandwich interconnect.

As can be seen from these descriptions of the alternate preferred embodiments of the present invention, the traditional interconnect and insulating materials of a semiconductor structure have been replaced by a coaxial conductor system. For greater structural strength, the metal forming the coaxial sheath can be made thick enough to completely fill the gaps between interconnect levels. In comparison to prior art structures utilizing silicon dioxide only as the inter-line insulating material, the formation of coaxial interconnects with ground planes has a distinct electrical advantage in that the all lines should have approximately the same characteristic impedance per unit length. This occurs since an ability to wrap the shield material intimately around each individual wire has been developed. Of equal, if not greater importance, is the formation of coaxial interconnects with ground planes that electrically shield local interconnects from crosstalk and can be used to remove thermal energy from the chip.

It will be understood that various changes in the details, materials, and arrangements of the components which have been described and illustrated in order to explain the nature of this invention, may be made by those skilled in the art without departing from the principle and scope of the invention as expressed in the following claims.

We claim:

1. A method of fabricating a high performance interconnect structure for electrically connecting regions in a semiconductor substrate, said method comprising the steps of:
    (a) forming a first dielectric layer on said substrate;
    (b) forming contact holes in said first dielectric layer in predetermined spaced relation with said regions to expose contact areas thereon;
    (c) forming a first metal layer over said first dielectric layer and into said contact holes, making contact with said contact areas;
    (d) forming a first level of interconnects in said first metal layer;
    (e) forming a second dielectric layer, having a substantially planar upper surface, over said first level of interconnects;
    (f) forming at least one via opening in said second dielectric layer in predetermined spaced relation with said underlying first level of interconnects;
    (g) forming a second metal layer over said second dielectric layer and into said via openings, making contact with said exposed regions of said first level of interconnects;
    (h) patterning said second metal layer into a second level of interconnects; and
    (i) removing said second dielectric layer.

2. The method in accordance with claim 1 additionally comprising the steps of:
    (j) repeating steps (e) through (h) at least once to form at least a third level of interconnects; and
    (k) removing each dielectric layer formed as a result of performing step (e).

3. The method in accordance with claim 2 wherein step (a) comprises the steps of:
    (i) forming a dielectric layer on said substrate; and
    (ii) forming an etch stop dielectric layer over said dielectric layer.

4. The method in accordance with claim 3 wherein step (c) comprises the steps of:
    (i) forming an electrically conductive adhesion layer over said etch stop dielectric layer and into said contact holes, making contact with said contact areas;
    (ii) forming an electrically conductive barrier layer over said adhesion layer; and
    (iii) forming a metal layer over said electrically conductive barrier layer.

5. The method in accordance with claim 4 wherein step (e) comprises the steps of:
    (i) forming a protective dielectric layer over said first level of interconnects;
    (ii) forming a dielectric layer over said first protective dielectric layer; and
    (iii) planarizing the upper surface of said dielectric layer.

6. The method in accordance with claim 5 wherein step (g) comprises the steps of:
    (i) forming an electrically conductive adhesion layer over said second dielectric layer and into said via openings, making contact with said exposed regions of said first level of interconnects; and
    (ii) forming a metal layer over said electrically conductive adhesion layer.

7. The method in accordance with claim 1 additionally comprising the step of forming a dielectric layer around said interconnects, leaving a gap between those portions of the dielectric layer which surround adjacent interconnects.

8. The method in accordance with claim 7 wherein said additional step comprises depositing a layer of silicon dioxide around said interconnects.

9. The method in accordance with claim 7 additionally comprising the step of forming an electrically conductive layer around said dielectric layer.

10. The method in accordance with claim 7 additionally comprising the step of forming an electrically conductive layer around said dielectric layer, said electrically conductive layer substantially filling in said gaps.

11. The method in accordance with claim 10 wherein said additional step comprises depositing a layer of tungsten around said layer of silicon dioxide.

12. A method of fabricating a high performance interconnect structure for electrically connecting regions in a semiconductor substrate, said method comprising the steps of:
    (a) forming a first dielectric layer on said substrate;
    (b) forming contact holes in said first dielectric layer in predetermined spaced relation with said regions to expose contact areas thereon;
    (c) forming a first layer of a first electrically conductive material over said dielectric layer and into said contact holes, making contact with said contact areas;
    (d) forming a second layer of a second electrically conductive material over said first electrically conductive layer;
    (e) forming at least one post in said second electrically conductive layer;

(f) forming a first level of interconnects in said first electrically conductive layer, said at least one post being in predetermined spaced relation to and in contact with said first level of interconnects;

(g) forming a second dielectric layer, having a substantially planar upper surface, over said at least one post and said first level of interconnects;

(h) etching back said second dielectric layer until the top surface of said at least one post is exposed;

(i) forming a third electrically conductive layer, comprising said first electrically conductive material, over said second dielectric and into contact with said exposed top surface of said at least one post;

(j) patterning said third electrically conductive layer into a second level of interconnects; and (k) removing said second dielectric layer.

13. The method in accordance with claim 12 additionally comprising the steps of:
(l) repeating steps (g) through (j) at least once to form at least a third level of interconnects; and
(m) removing each dielectric layer formed as a result of performing step (g).

14. The method in accordance with claim 13 wherein step (e) comprises the steps of:
(i) forming a mask defining at least one post region;
(ii) etching said second electrically conductive layer around said mask with a second etchant which reacts with said second electrically conductive material but is substantially unreactive with said first electrically conductive material.

15. The method in accordance with claim 14 wherein step (f) comprises the steps of:
(i) forming a mask defining a pattern for said first level of interconnects; and
(ii) etching said first electrically conductive material around said mask using an etchant which reacts with said first electrically conductive material but is substantially unreactive with said second electrically conductive material and said underlying first dielectric layer.

16. The method in accordance with claim 15 wherein comprises the steps of:
(i) forming a mask defining a pattern for said second level of interconnects; and
(ii) etching said first electrically conductive material around said mask using an etchant which reacts with said first electrically conductive material but is substantially unreactive with said second electrically conductive material and said underlying second dielectric layer.

17. The method in accordance with claim 12 wherein steps (c) and (i) comprise the steps of:
(i) forming a first layer of an aluminum-silicon mixture;
(ii) forming a first titanium layer over said first aluminum-silicon layer; and
(iii) forming at least a second aluminum-silicon layer over said first titanium layer.

18. The method in accordance with claim 17 additionally comprising the steps of:
(iv) forming at least a second titanium layer over said second aluminum-silicon layer;
(v) forming a third aluminum-silicon layer over said second titanium layer;
(vi) forming a protective layer over the third aluminum-silicon layer.

19. The method in accordance with claim 18 wherein said protective layer comprises tungsten.

20. A method of fabricating a high performance interconnect structure for electrically connecting regions in a semiconductor substrate, said method comprising the steps of:
(a) forming a first dielectric layer on said substrate, said first dielectric layer having a substantially planar upper surface;
(b) forming contact holes in said first dielectric layer in predetermined spaced relation with said regions to expose contact areas thereon;
(c) forming electrically conductive posts in said contact holes making contact with said contact areas, each post having an upper surface which is substantially coplanar with the upper surface of said first dielectric layer;
(d) forming a first electrically conductive layer over said dielectric layer and into contact with the upper surfaces of said posts;
(e) forming a first level of interconnects in said first electrically conductive layer;
(f) forming a second dielectric layer, having a substantially planar upper surface, over said first level of interconnects;
(g) forming at least one via opening in said second dielectric layer in predetermined spaced relation with said underlying first level of interconnects;
(h) forming an electrically conductive post in each via opening, said electrically conductive post having an upper surface which is substantially coplanar with the upper surface of said second dielectric layer;
(i) forming a second electrically conductive layer over said second dielectric layer and into contact with the upper surface of the post in each via in said second dielectric layer;
(j) patterning said second electrically conductive layer into a second level of interconnects; and
(k) removing said second dielectric layer.

21. The method in accordance with claim 20 additionally comprising the steps of:
(l) repeating steps (f) through (j) at least once to form at least a third level of interconnects; and
(m) removing each dielectric layer formed as a result of performing step (f).

22. The method in accordance with claim 20 wherein step (d) and step (i) each comprises the steps of
(i) forming a first layer of an aluminum-silicon mixture;
(ii) forming a first layer of titanium over said first aluminum-silicon layer; and
(iii) forming at least a second layer of an aluminum-silicon mixture over said first titanium layer.

23. The method in accordance with claim 22 additionally comprising the steps of:
(iv) forming at least a second layer of titanium over said second aluminum-silicon layer;
(v) forming a third aluminum-silicon layer over said second titanium layer; and
(vi) forming a protective layer over the third layer of aluminum-silicon.

24. The method in accordance with claim 22 where said aluminum-silicon mixture comprises approximately 1% to 1.5% of silicon by weight.

25. The method in accordance with claim 24 wherein the protective layer comprises tungsten.

26. The method in accordance with claim 25 wherein said aluminum-silicon layers are formed to a thickness of approximately 2500A; said titanium layers are formed to a thickness of approximately of 200A; and said tungten protective layer is formed to a thickness of 1000A.

27. The method in accordance with claim 1 were in steps (c) and (g), each comprises the steps of:
(i) forming a first layer of aluminum-silicon mixture;
(ii) forming a first layer of titanium over said first aluminum-silicon layer
(iii) forming at least a second aluminum-silicon layer over said first titanium layer.

28. The method in accordance with claim 27 additionally comprises the steps of:
(iv) forming a second titanium layer over said second aluminum-silicon layer;
(v) forming a third aluminum-silicon layer over said second titanium layer;
(vi) forming a protective layer over said third aluminum-silicon layer.

29. The method in accordance with claim 28 wherein said protective layer comprises tungsten.

* * * * *